(12) United States Patent
Lee et al.

(10) Patent No.: US 7,803,673 B2
(45) Date of Patent: Sep. 28, 2010

(54) METHOD OF MANUFACTURING A THIN FILM TRANSISTOR SUBSTRATE

(75) Inventors: Duck-Jung Lee, Cheonan-si (KR);
Dae-Ho Song, Whanju-gun (KR);
Kyung-Seop Kim, Suwon-si (KR);
Yong-Eui Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 472 days.

(21) Appl. No.: 11/871,457

(22) Filed: Oct. 12, 2007

(65) Prior Publication Data

US 2008/0090342 A1   Apr. 17, 2008

(30) Foreign Application Priority Data

Oct. 12, 2006 (KR) .................. 10-2006-0099187

(51) Int. Cl.
*H01L 21/00* (2006.01)
(52) U.S. Cl. .................. 438/158; 438/30; 438/149; 438/197; 438/199; 438/201; 438/211; 438/238; 438/257; 438/597; 438/723; 438/724; 438/743; 438/744; 438/756; 438/757; 345/87; 257/E29.117
(58) Field of Classification Search .......... 345/87
See application file for complete search history.

(56) References Cited

U.S. PATENT DOCUMENTS

| 6,518,630 | B2 * | 2/2003 | You et al. ............ 257/380 |
| 7,102,718 | B1 | 9/2006 | Yamazaki et al. |
| 2002/0149724 | A1 | 10/2002 | Kawachi et al. |
| 2003/0155612 | A1 | 8/2003 | Kawachi et al. |
| 2006/0076562 | A1 | 4/2006 | Lee et al. |
| 2006/0163741 | A1 | 7/2006 | Bae et al. |
| 2006/0189054 | A1 | 8/2006 | Kim et al. |
| 2006/0204896 | A1 * | 9/2006 | Park et al. ............ 430/311 |

FOREIGN PATENT DOCUMENTS

EP   1 077 481 A2   2/2001

OTHER PUBLICATIONS

European Search Report for Application No. 07019889.0-1528; Dated: Feb. 11, 2008 (All references cited in Search Report are listed above).
"Technologies hochintegrierter Schaltungen"; Authors: D. Widmann, et al. Springer Verlag, Berlin, XP0002466833; pp. 210-221 (1988) (Cited in Search Report listed below).
European Search Report for Application No.: 07019889.0-1528; Dated: Feb. 11, 2008 (All references cited in Search Report are listed above).

* cited by examiner

*Primary Examiner*—Charles D Garber
*Assistant Examiner*—Yasser A Abdelaziez
(74) *Attorney, Agent, or Firm*—Cantor Colburn LLP

(57) ABSTRACT

A method of manufacturing a thin film transistor ("TFT") substrate includes forming a gate insulating film and an active layer on a substrate, forming a data metal layer including a first, second, and third metal layers on the active layer, forming a first photoresist pattern on the data metal layer, dry-etching the third metal layer by using the first photoresist pattern, simultaneously dry-etching the second and first metal layers by using the first photoresist pattern, dry-etching the active layer by using the first photoresist pattern, etching the first photoresist pattern to form a second photoresist pattern by which the channel region is removed and forming a source electrode and a drain electrode by dry-etching the channel region of the data metal layer by using the second photoresist pattern.

20 Claims, 15 Drawing Sheets

METHOD OF MANUFACTURING A THIN FILM TRANSISTOR SUBSTRATE

This application claims priority to Korean Patent Application No. 2006-99187, filed on Oct. 12, 2006, and all the benefits accruing therefrom under 35 U.S.C. §119, the contents of which in its entirety are herein incorporated by reference.

BACKGROUND OF THE INVENTION

1. Field of the Invention

The present invention relates to a method of manufacturing a thin film transistor ("TFT") substrate. More particularly, the present invention relates to a method of manufacturing a TFT substrate capable of simplifying manufacturing processes thereof.

2. Description of the Related Art

In general, a liquid crystal display ("LCD") apparatus includes a TFT substrate, a color filter substrate and a liquid crystal layer. The TFT substrate includes TFTs and pixel electrodes. The color filter substrate includes color filters and a common electrode. The liquid crystal layer is disposed between the thin TFT substrate and the color filter substrate.

A process of manufacturing a TFT substrate is carried out through a photolithography process using a mask. Recently, a four mask sheet process using only four masks has been developed for simplifying the manufacturing process.

For etching a data metal layer using the four mask sheet process, a first etching stage for forming data lines and a second etching stage for etching a channel region are carried out.

Since a wet etching process is applied to the first and second etching stages in a conventional four mask sheet process, a width of a line becomes larger for reducing an increase of a width of a channel and a dispersion of a process.

In order to solve the above-mentioned problem, a manufacturing process using a wet etching process for the first etching stage and a dry etching process for the second etching stage has been developed. However, using both the dry etching process and wet etching process in the manufacturing process is complicated, and increases manufacturing time.

BRIEF SUMMARY OF THE INVENTION

The present invention provides a method of manufacturing a TFT substrate, which only uses the dry-etching process and can simplify the manufacturing process.

In exemplary embodiments, the method of manufacturing a TFT substrate includes sequentially forming a gate insulating film and an active layer on a substrate, the substrate having a gate wire including a gate line and a gate electrode connected to the gate line formed thereon, forming a data metal layer on the active layer, the data metal layer including a first metal layer, a second metal layer and a third metal layer, the first metal layer, the second metal layer and the third metal layer disposed in sequence, forming a first photoresist pattern on the data metal layer, the first photoresist pattern having a thinner thickness at a channel region than at an adjacent region, dry-etching the third metal layer by using the first photoresist pattern, simultaneously dry-etching the second metal layer and the first metal layer by using the first photoresist pattern to form a data line, dry-etching the active layer by using the first photoresist pattern, removing a portion of the first photoresist pattern to form a second photoresist pattern by which the channel region is removed, and forming a source electrode connected to the data line and a drain electrode spaced apart from the source electrode by dry-etching the channel region of the data metal layer by using the second photoresist pattern.

The first metal layer may include molybdenum, the second metal layer may include aluminum and the third metal layer may include molybdenum.

Boron trichloride ($BCl_3$) and chlorine gas ($Cl_2$) may be used for simultaneously etching the first metal layer and the second metal layer by using the first photoresist pattern. Boron trichloride ($BCl_3$) and chlorine gas ($Cl_2$) may be mixed in a ratio from about 1:1 to about 1:5.

Dry-etching the channel region of the data metal layer by using the second photoresist pattern may be performed by dry-etching the third metal layer by using the second photoresist pattern, and simultaneously dry-etching the second metal layer and the first metal layer by using the second photoresist pattern.

A TFT may be formed by removing the ohmic contact layer within the channel region by using the second photoresist pattern after forming the source electrode and the drain electrode.

A protective film may be formed on the substrate having the TFT formed thereon. A pixel electrode electrically connected to the drain electrode may be formed on the protective film.

In other exemplary embodiments, a method of manufacturing a TFT substrate includes sequentially forming a gate insulating film and an active layer on a substrate, the substrate having a gate wire including a gate line and a gate electrode connected to the gate line formed thereon, forming a data metal layer on the active layer, the data metal layer including a first metal layer, a second metal layer and a third metal layer, the first metal layer, the second metal layer and the third metal layer disposed in sequence, forming a photoresist pattern on the data metal layer having a thinner thickness at a channel region than at an adjacent region, dry-etching the third metal layer by using the photoresist pattern, dry-etching the second metal layer by using the photoresist pattern, simultaneously dry-etching the active metal layer and the first metal layer by using the photoresist pattern to form a data line and forming a source electrode connected to the data line and a drain electrode spaced apart from the source electrode by dry-etching the channel region of the data metal layer by using the photoresist pattern.

The first metal layer may include molybdenum, the second metal layer may include aluminum, and the third metal layer may include molybdenum.

Sulfur hexafluoride ($SF_6$) gas and chlorine gas ($Cl_2$) may be used for simultaneously etching the first metal layer and the active layer by using the photoresist pattern. Sulfur hexafluoride ($SF_6$) and chlorine gas ($Cl_2$) may be mixed in a ratio from about 1:5 to about 1:7.

In still other exemplary embodiments, a method of manufacturing a TFT substrate includes sequentially forming a gate insulating film and an active layer on a substrate, the substrate having a gate wire including a gate line and a gate electrode connected to the gate line formed thereon, forming a data metal layer on the active layer, the data metal layer including a first metal layer, a second metal layer and a third metal layer disposed in sequence, forming a photoresist pattern on the data metal layer having a thinner thickness at a channel region than at an adjacent region, dry-etching the third metal layer by using the photoresist pattern, dry-etching the second metal layer by using the photoresist pattern, dry-etching the first metal layer by using the photoresist pattern, and dry-etching the active layer by using the photoresist pattern, wherein at least two dry-etching processes dry-etching the third metal layer, the second metal layer, the first metal layer, and the active layer are performed simultaneously. The method does not include a wet-etching process.

According to the above, the first etching step forming the data line and the second etching step forming the channel are carried out using dry-etching processes. As a result, problems from a wet-etching process are solved and manufacturing processes can be simplified.

BRIEF DESCRIPTION OF THE DRAWINGS

The above and other aspects, features and advantages of the present invention will become readily apparent by reference to the following detailed description when considered in conjunction with the accompanying drawings wherein.

DETAILED DESCRIPTION OF THE INVENTION

Figure 1:
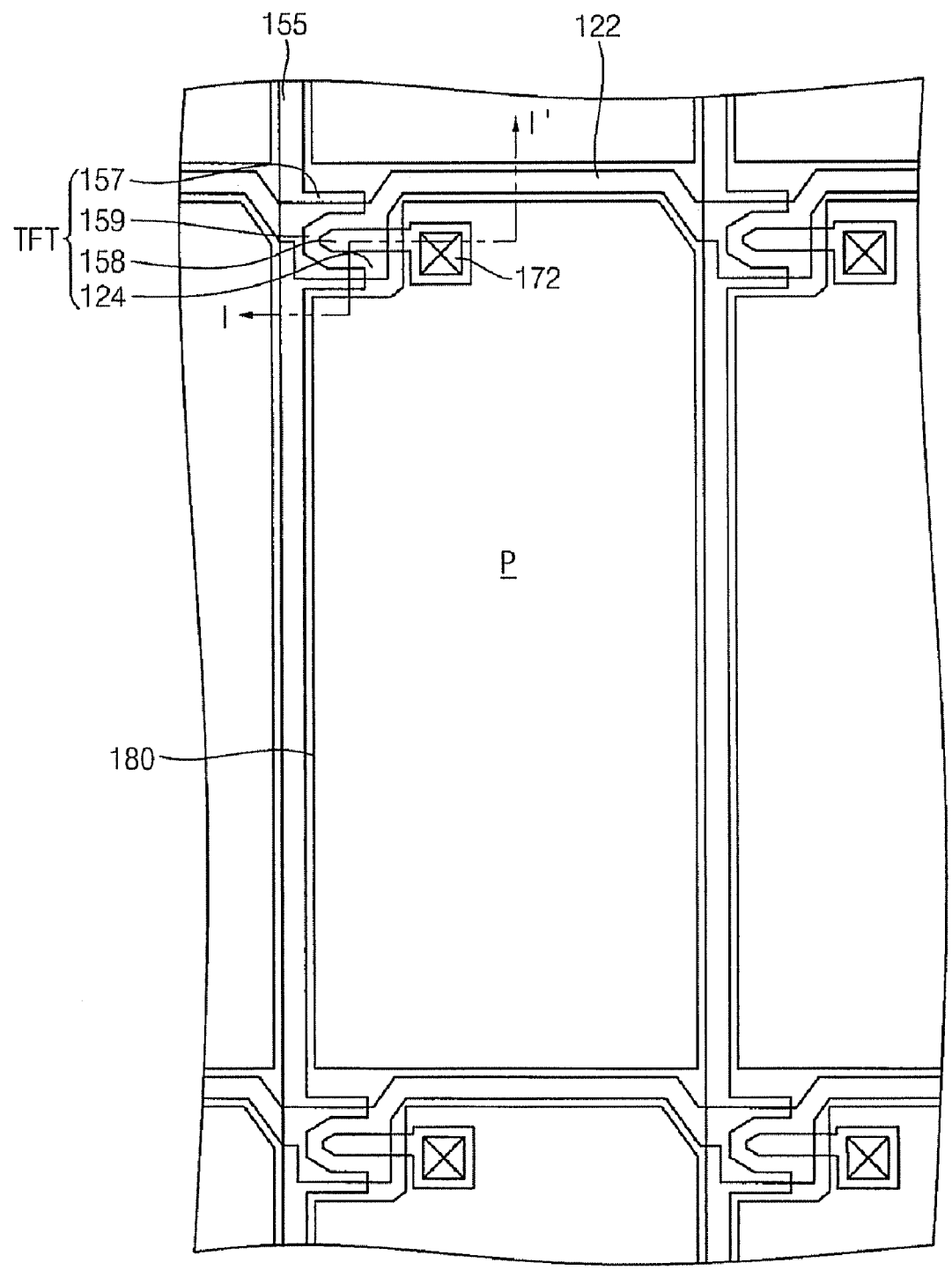
FIG. 1 is a plan view illustrating a portion of an exemplary thin film transistor ("TFT") substrate manufactured in accordance with an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view illustrating a portion of an exemplary thin film transistor ("TFT") substrate manufactured in accordance with an exemplary embodiment of the present invention. FIGS. 2 to 11 are cross-sectional views taken along line I-I' in FIG. 1 illustrating an exemplary manufacturing process of the exemplary TFT substrate in FIG. 1.

Figure 2:
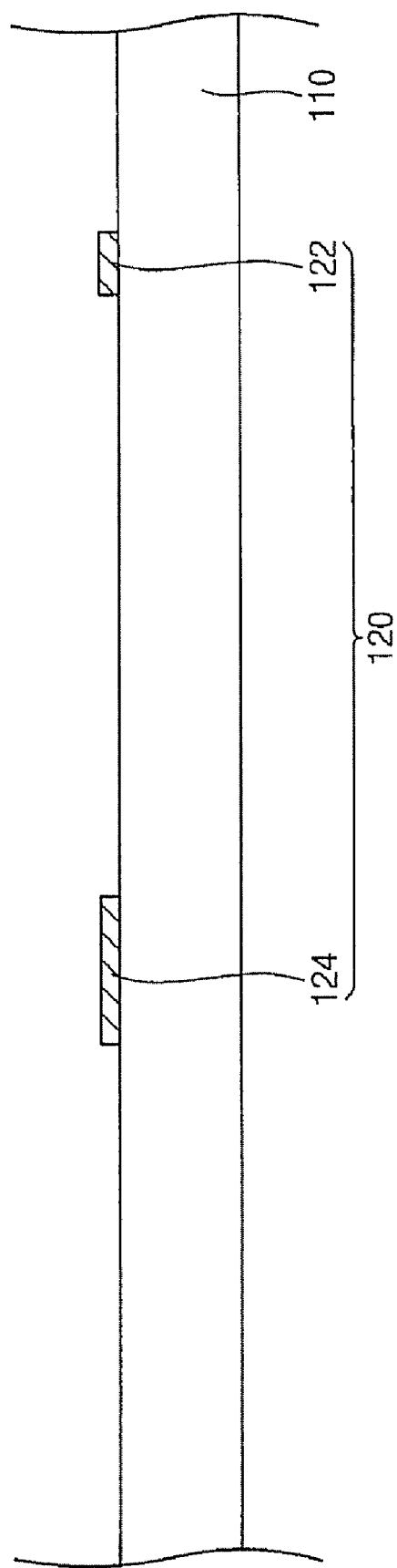
FIGS. 2 to 11 are cross-sectional views taken along line I-I' in FIG. 1 illustrating an exemplary manufacturing process of the exemplary TFT substrate in FIG. 1.

Referring to FIGS. 1 and 2, after forming a gate metal layer on a substrate 110, a gate wiring 120 including a gate line 122 and a gate electrode 124 connected to the gate line 122 is formed by patterning the gate metal layer through a photolithography process using a first exposing mask. The gate metal layer, for example, may be formed on the substrate 110 through a sputtering method.

The substrate 110, for example, includes a transparent insulating substrate such as a glass substrate.

The gate wiring 120, for example, includes at least one of aluminum (Al), molybdenum (Mo), chromium (Cr), tantalum (Ta), titanium (Ti), Tungsten (W), copper (Cu), silver (Ag) and alloy thereof. The gate wiring 120, for example, may include two or more metal layers including different physical properties from each other. The gate wiring 120 may have an Al/Mo dual layer structure with an aluminum (Al) layer and a molybdenum (Mo) layer overlapped with each other for a low electric resistance. While exemplary embodiments of the gate wiring 120 have been described above, alternative exemplary embodiments of the gate wiring 120 may include other materials.

Referring to FIG. 1, the gate line 122 may extend along a substantially horizontal direction such as a first direction. The gate electrode 124 is connected to the gate line 122. The gate electrode 124 forms a gate terminal of a TFT. The TFT is a switching device and is disposed at each pixel P.

Figure 3:
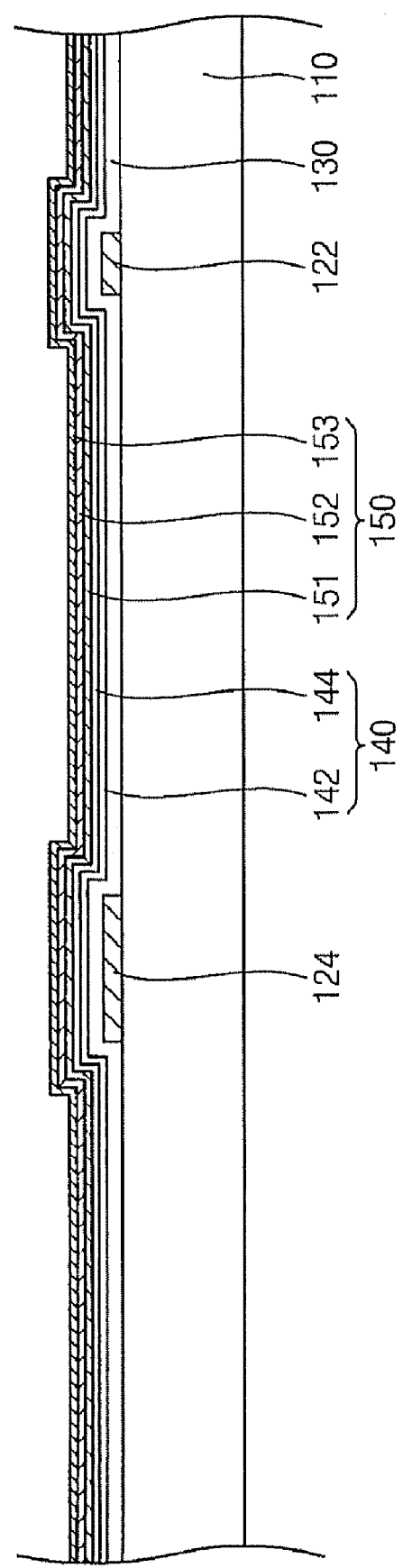

Referring to FIG. 3, a gate insulating film 130 and an active layer 140 are sequentially formed on the substrate 110 including the gate wiring 120 formed on the substrate. The gate insulating film 130 and the active layer 140 may be formed by a plasma enhanced chemical vapor deposition ("PECVD") method.

The gate insulating film 130 protects and insulates the gate wiring 120 from a data metal layer 150 which is to be formed on the gate insulating film 130, etc. The gate insulating film 130 includes, for example, silicon nitride ("SiNx") and silicon oxide ("SiOx"). The gate insulating film 130 may be formed through a chemical vapor deposition ("CVD") process such that the gate insulating film 130 has a certain thickness.

The active layer 140 includes a channel layer 142 and an ohmic contact layer 144. For example, the channel layer 142 may include amorphous silicon ("a-Si"). For example, the ohmic contact layer 144 may include amorphous silicon doped with an n-dopant to a high density (hereinafter "n+a-Si").

Then, the data metal layer 150 including a first metal layer 151, a second metal layer 152 and a third metal layer 153, which are sequentially disposed, is formed on the active layer 140. For example, the first metal layer 151 includes molybdenum (Mo), the second metal layer 152 includes aluminum (Al) and the third metal layer 153 includes molybdenum (Mo). Thus, the data metal layer 150 includes a Mo/Al/Mo triple layered structure for a low electric resistance. The data metal layer 150 is formed on the active layer 140 by a method such as a sputtering method.

Figure 4:
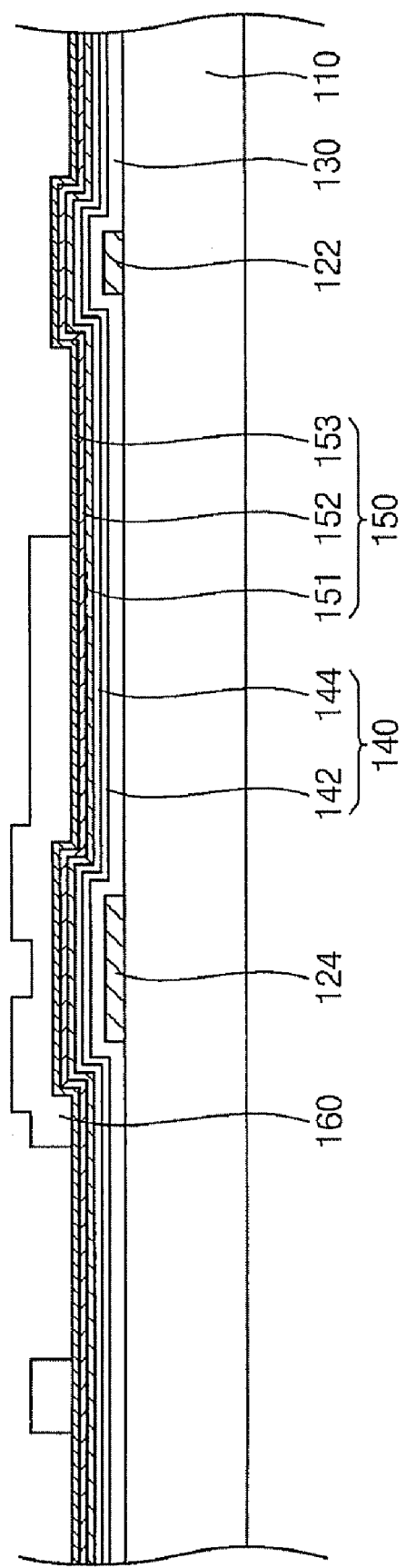

Referring to FIG. 4, after forming a photoresist film on the data metal layer 150, the photoresist film is patterned to form a first photoresist pattern 160 through a photolithography process using a second exposing mask such as a slit mask or a half tone mask. The first photoresist pattern 160 may include a positive type photoresist with an exposed region which is removed by a developing solution.

The first photoresist pattern 160 has a relatively thinner thickness at a channel region than a portion of the first photoresist pattern 160 that is adjacent to the channel region. For example, a thickness of the first photoresist pattern 160, which corresponds to the channel region, may be in a range from about 5000 angstroms (Å) to about 8000 Å.

Figure 5:
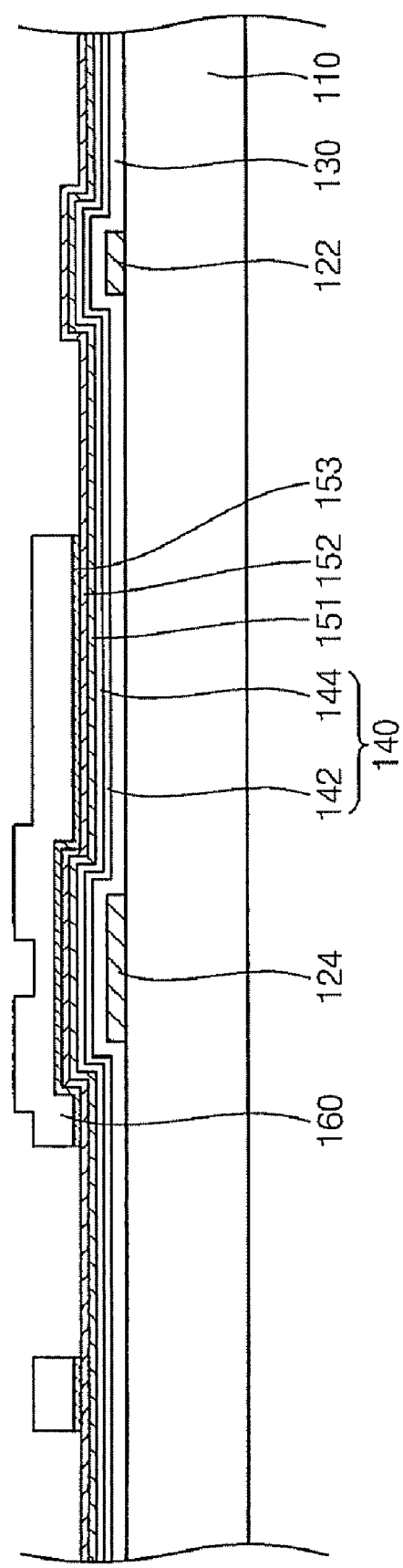

Referring to FIG. 5, the third metal layer 153, which is an uppermost layer of the data metal layer 150, is dry-etched by using the first photoresist pattern 160 as an etching mask.

Sulfur hexafluoride ($SF_6$) and chlorine gas ($Cl_2$) may be mainly used for dry-etching of the third metal layer 153 including molybdenum (Mo). In an exemplary embodiment, sulfur hexafluoride ($SF_6$) and chlorine gas ($Cl_2$) are mixed in a ratio from about 1:0.5 to about 1:1.5.

Figure 6:
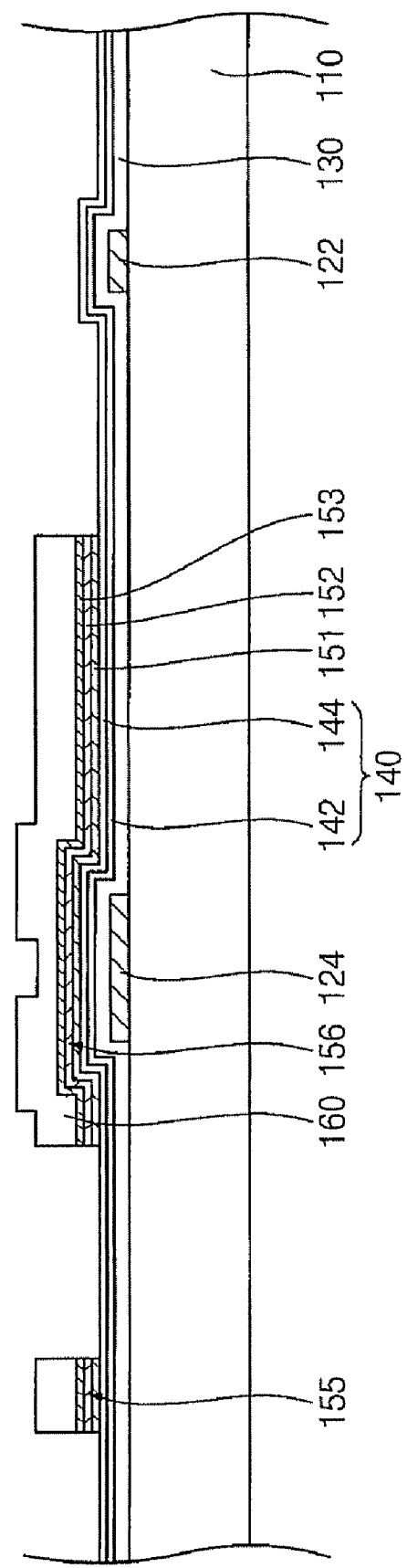

Referring to FIGS. 1 and 6, the second metal layer 152 and the first metal layer 151 are simultaneously dry-etched by using the first photoresist pattern 160 as an etching mask.

Boron trichloride ($BCl_3$) and chlorine gas ($Cl_2$) are mainly used as an etching gas for dry-etching the second metal layer 152 including aluminum (Al) and the first metal layer 151 including molybdenum (Mo). In an exemplary embodiment, boron trichloride ($BCl_3$) and chlorine gas ($Cl_2$) are mixed in a ratio from about 1:1 to about 1:5. When a proportion of boron trichloride ($BCl_3$) within the gas mixture is relatively low, only the second metal layer 152 including aluminum (Al) may be dry-etched. However, when the proportion of boron trichloride ($BCl_3$) in the gas mixture increases, the second metal layer 152 including aluminum (Al) and the first metal layer 151 including molybdenum (Mo) may be simultaneously dry-etched.

If the third metal layer 153, the second metal layer 152 and the first metal layer 151 are respectively dry-etched, then the active layer 140 may be perforated at the channel region during the dry-etching process, owing to an inefficiency of a photoresist which remains disposed at the channel region. Thus, a manufacturing process can be simplified and a margin of the process is increased by simultaneously dry-etching the second metal layer 152 and the first metal layer 151. Additionally, the perforation of the channel region can be prevented or substantially reduced.

After dry-etching the first metal layer 151 and the second metal layer 152, the third metal layer 153 is completed by dry-etching using the first photoresist pattern 160 and a metal pattern 156 for a data line 155 and source/drain remains. Referring to FIG. 1, the data line 155 may extend along a direction such as a second direction substantially perpendicular to the gate line 122.

Figure 7:
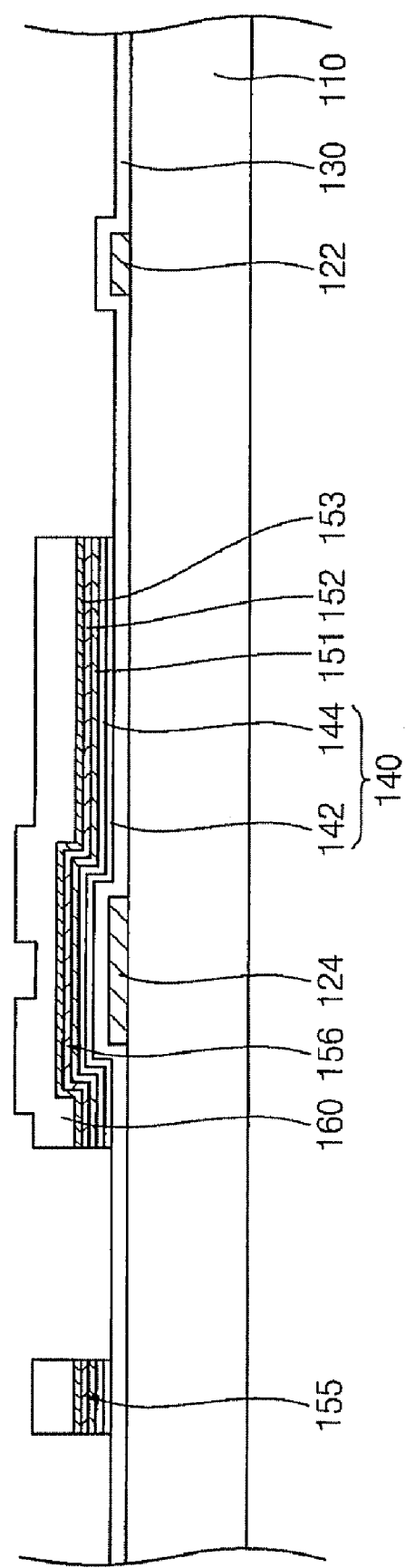

Referring to FIG. 7, the active layer 140 is dry-etched by using the first photoresist pattern 160 as an etching mask.

An outline of the remaining active layer 140 and outlines of the metal pattern 156 for the data line 155 and source/drain are substantially coincided by etching the data metal layer 150 and the active layer 140 by using the same first photoresist pattern 160.

Figure 8:
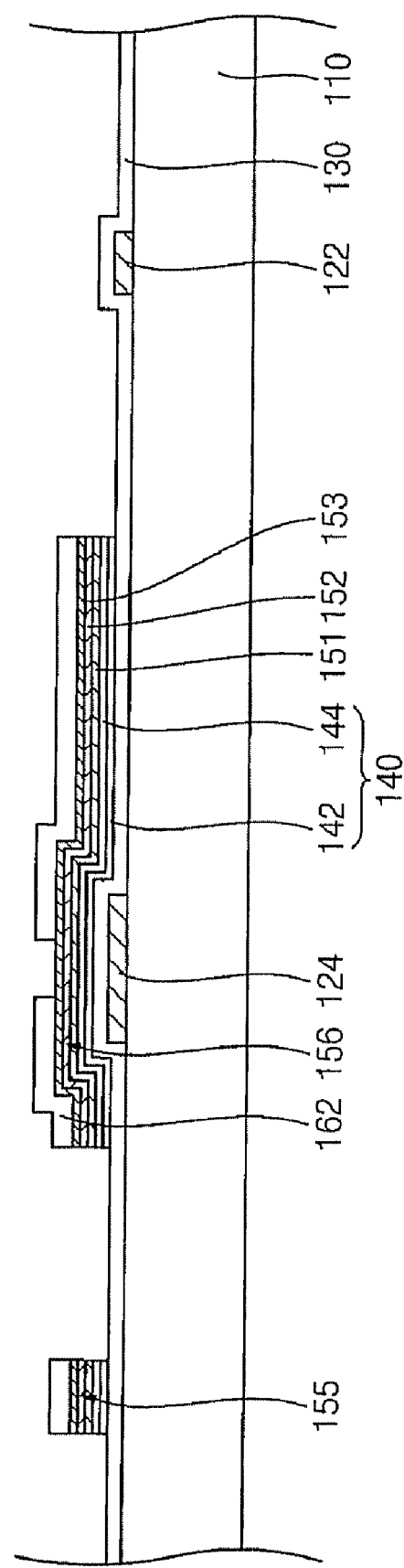

Referring to FIG. 8, the first photoresist pattern 160 is etched by a predetermined thickness through an ashing process using oxygen plasma to form a second photoresist pattern 162 including an opened portion corresponding to the channel region. As a result, the metal pattern 156 for source/drain corresponding to the channel region is exposed.

Figure 9:
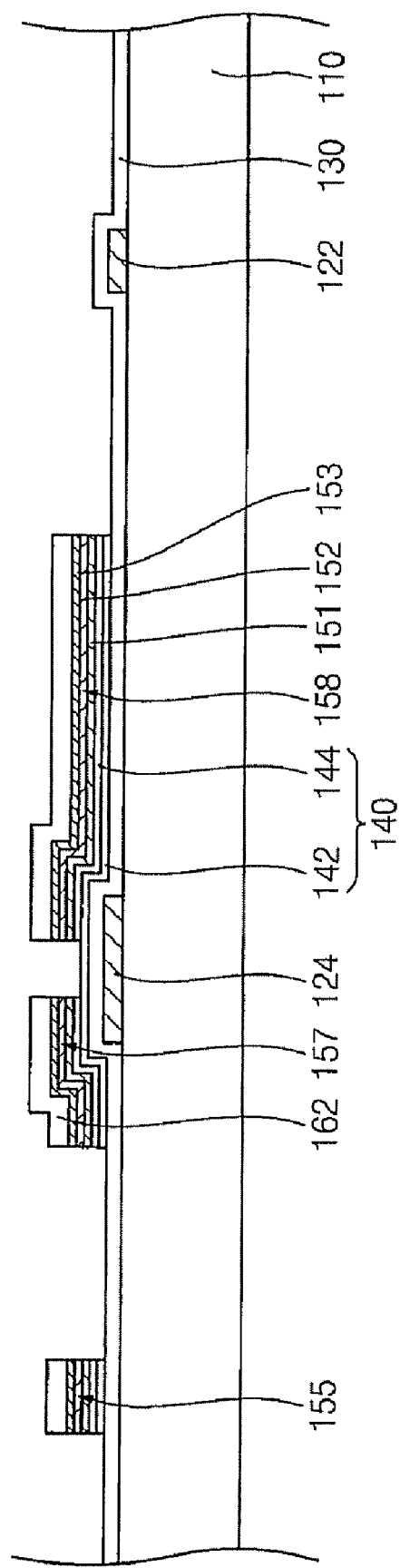

Referring to FIGS. 1 and 9, the channel region of the metal pattern 156 for source/drain is dry-etched by using the second photoresist pattern 162 as an etching mask.

A dry-etching process using the second photoresist pattern 162 may be substantially the same as a dry-etching process using the first photoresist pattern 160 as described above. For example, in a dry-etching process using the second photoresist pattern 162, the third metal layer 153 may be firstly dry-etched and then, the second metal layer 152 and the first metal layer 151 may be simultaneously dry-etched. In an alternative exemplary embodiment, in the dry-etching process using the second photoresist pattern 162, the third metal layer 153, the second metal layer 152 and the first metal layer 151 may be respectively dry-etched.

When etching the channel region of the metal pattern 156 for source/drain is completed through the dry-etching process using the second photoresist pattern 162, a source electrode 157 and a drain electrode 158 are formed. The source electrode 157 is connected to the data line 155 to define a source terminal of the TFT. The drain electrode 158 is spaced apart from the source electrode 157 to define a drain terminal of the TFT.

Next, the ohmic contact layer 144 of the channel region is etched by using the second photoresist pattern 162 as an etching mask. Thus, the channel layer 142 is exposed between the drain electrode 158 and the source electrode 157, and a channel 159 of the TFT is formed.

As described above, problems such as an increase of width of lines in wet-etching may be solved, and the manufacturing process can be simplified by dry-etching all of the first, second and third metal layers 151, 152 and 153.

Continually, the second photoresist pattern 162, which remains on the data line 155, the source electrode 157 and the drain electrode 158, is removed. For example, the second photoresist pattern 162 may be removed through a strip process using a strip solution. Thereby, manufacturing of a TFT is completed.

Figure 10:
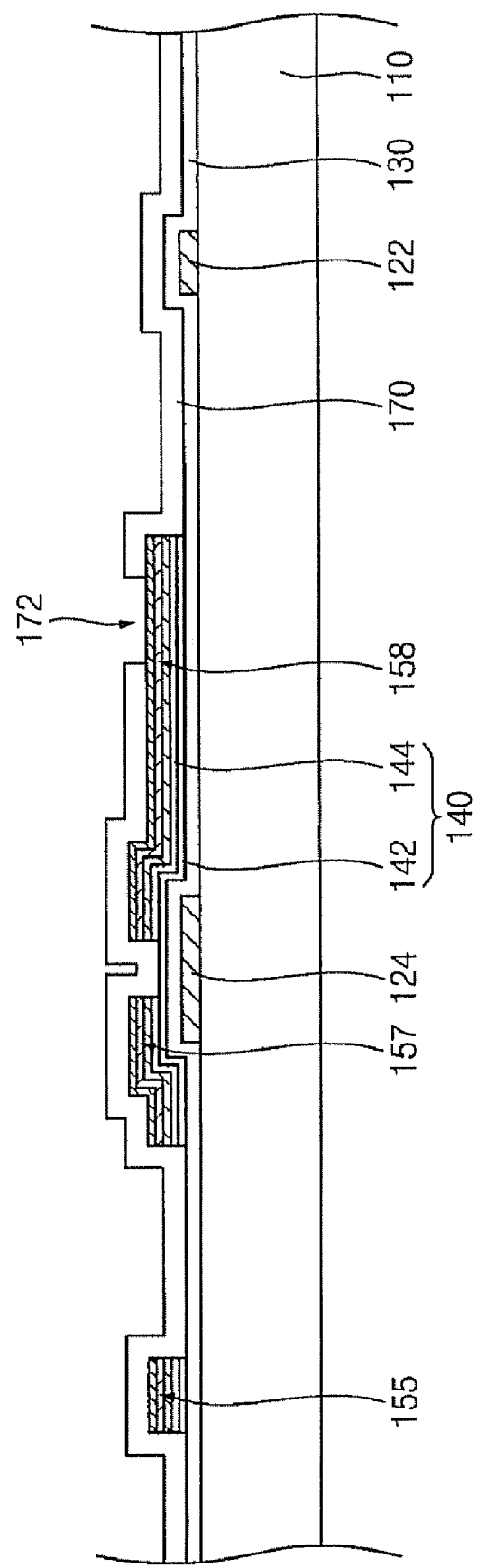

Referring to FIGS. 1 and 10, a protective film 170 is formed on the substrate 110 including the TFT formed on the substrate. The protective film 170 protects the TFT and the data line 155. The protective film 170 includes an insulating material such as silicon oxide ("SiOx") or silicon nitride ("SiNx"), such that the protective film 170 insulates the TFT and the data line 155 from a conductive layer which may be subsequently formed on the protective film 170. The protective film 170 may be formed by a CVD process and has a thickness in a range from about 500 Å to about 2000 Å.

Next, the protective film 170 is patterned through a photolithography process using a third exposing mask and then, a contact hole 172 exposing a portion of the drain electrode 158 is formed.

Figure 11:
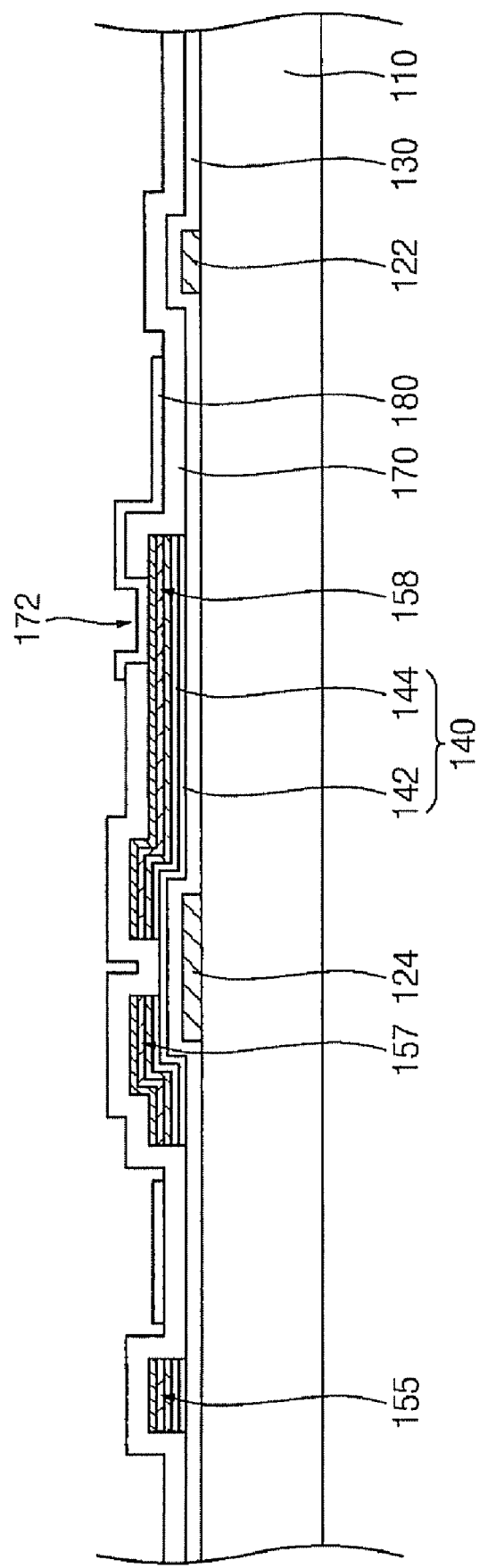

Referring to FIGS. 1 and 11, after forming a transparent conductive film (not shown) on the protective film 170, the transparent conductive film is patterned through a photolithography process using a fourth exposing mask to form a pixel electrode 180 in each of the pixels P.

The pixel electrode 180 is electrically connected to the drain electrode 158 through the contact hole 172 formed through the protective film 170. For example, the pixel electrode 180 may include indium zinc oxide ("IZO") or indium tin oxides ("ITO").

Meanwhile, an organic insulating film (not shown) may be formed on the protective film 170 for planarization before forming the pixel electrode 180.

FIGS. 12 to 15 are cross-sectional views illustrating an exemplary etching process of a metal layer for a data line in accordance with other exemplary embodiments of the present invention. A process before forming the metal layer for the data line is substantially the same as the process as shown in FIGS. 2 to 4. Thus, any further explanation concerning the above processes will be omitted.

Figure 12:
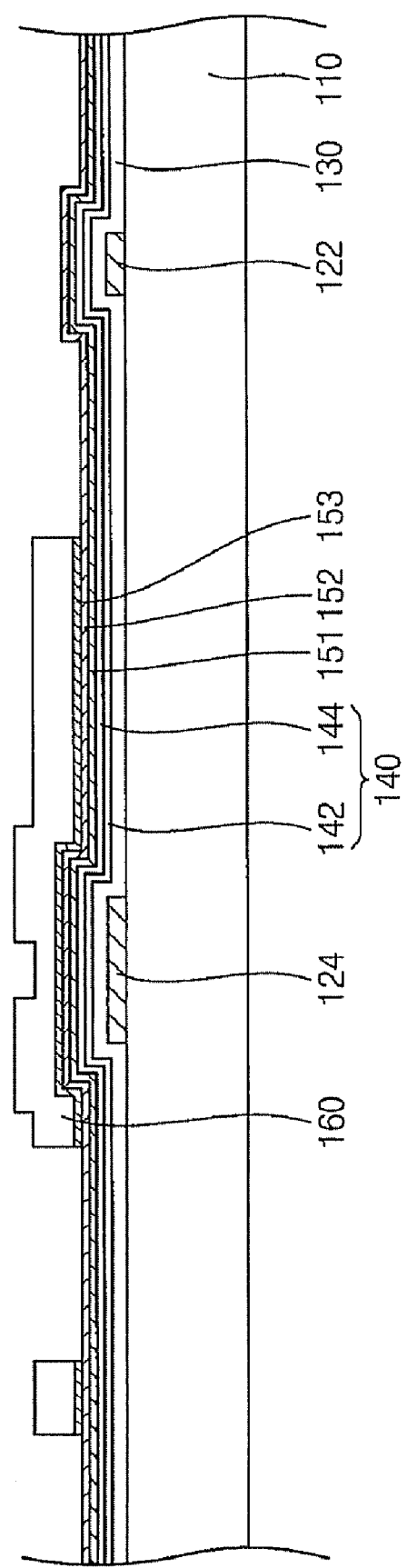
FIGS. 12 to 15 are cross-sectional views illustrating an exemplary etching process of the metal layer for a data line in accordance with other exemplary embodiments of the present invention.

Referring to FIG. 12, the third metal layer 153 is dry etched by using a photoresist pattern 160 having a relatively thinner thickness at a channel region than a portion of the photoresist pattern 160 corresponding to other regions such as regions disposed adjacent to the channel region.

Fluorine (F) series gas and chlorine gas ($Cl_2$) are, for example, used as etching gases for dry-etching the third metal layer 153 including molybdenum (Mo). For example, sulfur hexafluoride ($SF_6$) gas is used as the fluorine (F) series gas. In an exemplary embodiment, sulfur hexafluoride ($SF_6$) and chlorine gas ($Cl_2$) are mixed in a ratio from about 1:0.5 to about 1:1.5.

Figure 13:
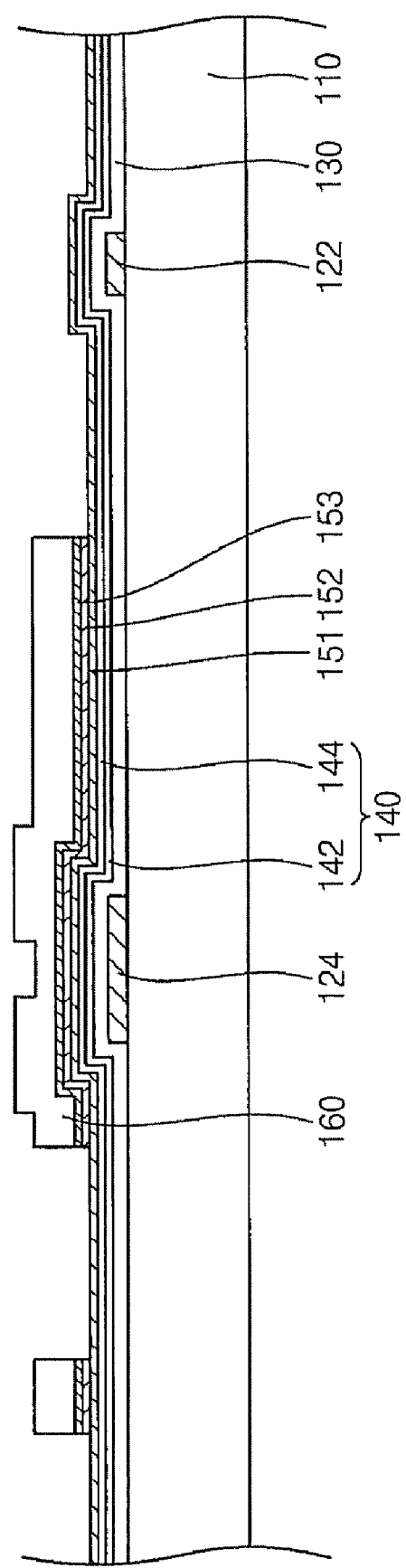

Referring to FIG. 13, the second metal layer 152 is dry-etched by using the photoresist pattern 160 as an etching mask.

Boron trichloride ($BCl_3$) and chlorine gas ($Cl_2$) are mainly used as etching gases for dry-etching of the second metal layer 152 including aluminum (Al). In an exemplary embodiment, boron trichloride ($BCl_3$) and chlorine gas ($Cl_2$) are mixed in a ratio from about 1:8 to about 1:12 for only etching the second metal layer 152.

Figure 14:
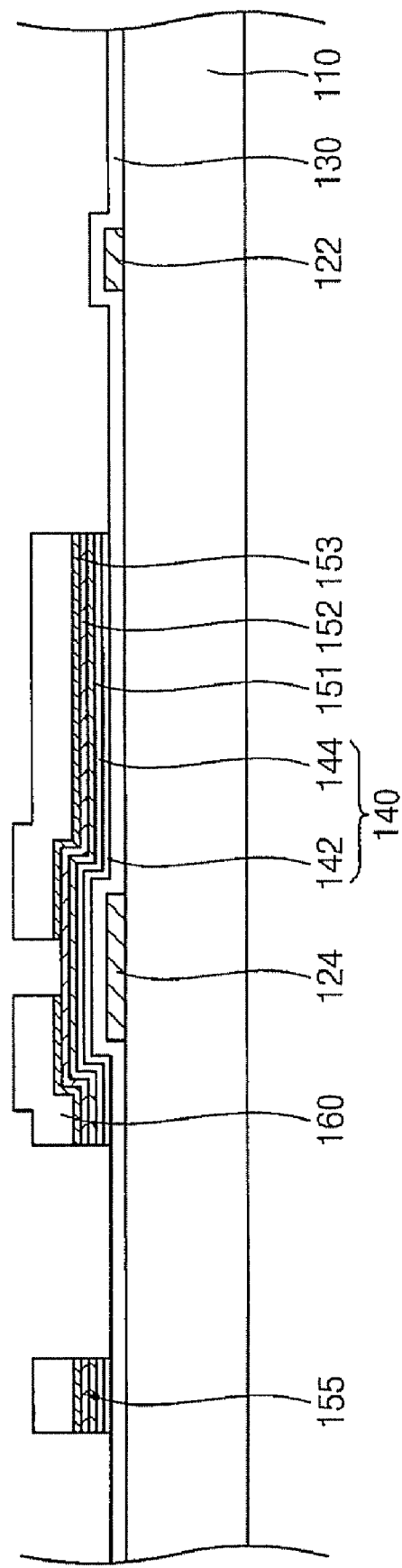

Referring to FIG. 14, the first metal layer 151 and the active layer 140 are simultaneously dry-etched by using the photoresist pattern 160 as an etching mask.

Fluorine (F) series gas and chlorine gas ($Cl_2$) are, for example, used as etching gases for simultaneously dry-etching the first metal layer 151 including molybdenum (Mo) and the active layer 140 including a-Si and n+a-Si. For example, sulfur hexafluoride ($SF_6$) gas is used as the fluorine (F) series gas. In an exemplary embodiment, sulfur hexafluoride ($SF_6$) and chlorine gas ($Cl_2$) are mixed in a ratio from about 1:5 to about 1:7. If a proportion of chlorine gas ($Cl_2$) in the gas mixture is relatively low, then only the first metal layer 151 including molybdenum (Mo) may be dry-etched. However, when the proportion of chlorine gas ($Cl_2$) in the gas mixture increases, the first metal layer 151 and the active layer 140 may be simultaneously dry-etched.

As described above, a manufacturing process can be simplified, and a margin of process is increased by simultaneously dry-etching the active layer 140 and the first metal layer 151. As a result, perforation at the channel region can be prevented or substantially reduced.

Meanwhile, when the first metal layer 151 and the active layer 140 are simultaneously dry-etched, the region of the photoresist pattern 160, which corresponds to a channel region, is opened such that the third metal layer 153 is simultaneously etched at the channel region.

For preventing the case in which the photoresist remains over the channel region, an ashing process may be additionally performed to completely remove the remaining photoresist at the channel region.

Figure 15:
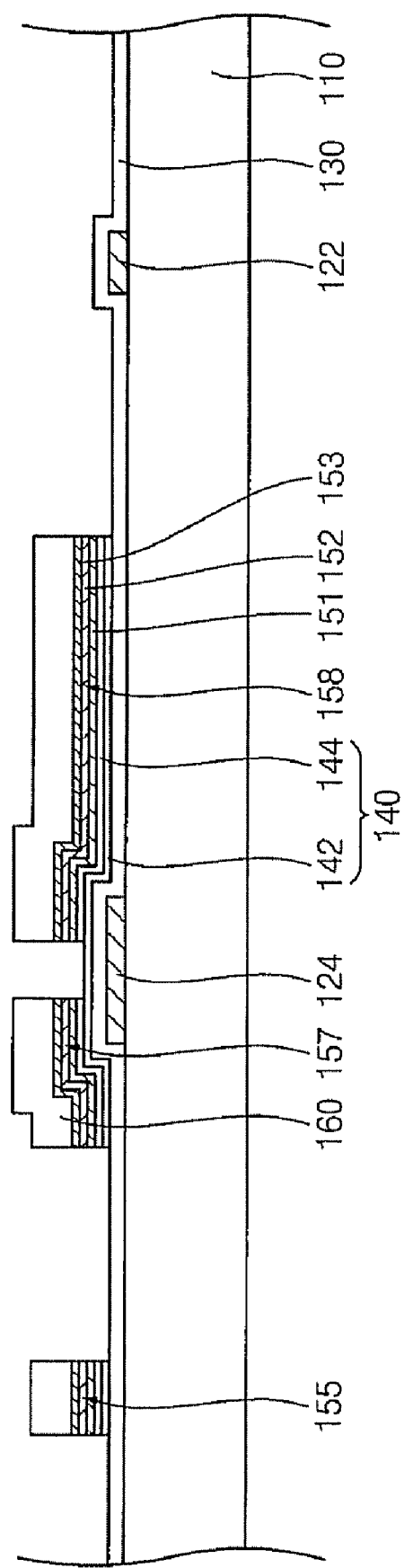

Referring to FIG. 15, the first metal layer 151 and the second metal layer 152 corresponding to the channel region are dry-etched by using the photoresist pattern 160 as an etching mask.

The dry-etching process for dry-etching the first metal layer 151 and the second metal layer 152 corresponding to the channel region is substantially the same as in FIG. 9. For example, the first metal layer 151 and the second metal layer 152 are simultaneously dry-etched by one dry-etching process. In an alternative exemplary embodiment, the first metal layer 151 and the second metal layer 152 may be respectively dry-etched.

Then, when the ohmic contact layer 144 of the channel region is etched, a portion of a channel layer 142 between the source electrode 157 and the drain electrode 158 is exposed to form the channel of the TFT.

Manufacturing processes subsequent to the above processes are substantially the same as in FIGS. 10 and 11. Thus, any further explanations will be omitted.

According to the above, a problem such as an increase of width of lines that occurs during wet-etching can be solved and the manufacturing process can be simplified by dry-etching the data metal layer with a Mo/Al/Mo triple layered structure Also, a manufacturing process can be simplified and a margin of the process is increased by simultaneously dry-etching an aluminum layer and a lower molybdenum layer or simultaneously dry-etching a lower molybdenum layer and an active layer. As a result, perforation of a channel region is prevented or substantially reduced.

Although some exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A method of manufacturing a thin film transistor substrate, the method comprising:
   sequentially forming a gate insulating film and an active layer on a substrate, the substrate having a gate wire including a gate line and a gate electrode connected to the gate line formed thereon;
   forming a data metal layer on the active layer, the data metal layer including a first metal layer, a second metal layer and a third metal layer disposed, in sequence;
   forming a first photoresist pattern on the data metal layer, the first photoresist pattern having a thinner thickness at a channel region than at an adjacent region;
   dry-etching the third metal layer by using the first photoresist pattern;
   simultaneously dry-etching the second metal layer and the first metal layer by using the first photoresist pattern to form a data line;
   dry-etching the active layer by using the first photoresist pattern;
   removing a portion of the first photoresist pattern to form a second photoresist pattern by which the channel region is removed; and
   forming a source electrode connected to the data line and a drain electrode spaced apart from the source electrode by dry-etching the channel region of the data metal layer by using the second photoresist pattern.

2. The method of claim 1, wherein the first metal layer comprises molybdenum, the second metal layer includes aluminum and the third metal layer includes molybdenum.

3. The method of claim 2, wherein boron trichloride (BCl$_3$) and chlorine gas (Cl$_2$) are used for simultaneously etching the second metal layer and the first metal layer by using the first photoresist pattern.

4. The method of claim 3, wherein boron trichloride (BCl$_3$) and chlorine gas (Cl$_2$) are mixed in a ratio from about 1:1 to about 1:5.

5. The method of claim 1, wherein dry-etching the channel region of the data metal layer by using the second photoresist pattern comprises:
   dry-etching the third metal layer by using the second photoresist pattern; and
   simultaneously dry-etching the second metal layer and the first metal layer by using the second photoresist pattern.

6. The method of claim 1, wherein the active layer comprises a channel layer having amorphous silicon and an ohmic contact layer having amorphous silicon in which ions are doped, and
   the method further comprising forming a thin film transistor by removing the ohmic contact layer within the channel region by using the second photoresist pattern after forming the source electrode and the drain electrode.

7. The method of claim 6, further comprising:
   forming a protective film on the substrate having the thin film transistor formed thereon; and
   forming a pixel electrode on the protective film, the pixel electrode electrically connected to the drain electrode.

8. A method of manufacturing a thin film transistor substrate, the method comprising:
   sequentially forming a gate insulating film and an active layer on a substrate, the substrate having a gate wire including a gate line and a gate electrode connected to the gate line formed thereon;
   forming a data metal layer on the active layer, the data metal layer including a first metal layer, a second metal layer and a third metal layer disposed, in sequence;
   forming a photoresist pattern on the data metal layer having a thinner thickness at a channel region than at an adjacent region;
   dry-etching the third metal layer by using the photoresist pattern;
   dry-etching the second metal layer by using the photoresist pattern;
   simultaneously dry-etching the first metal layer and the active layer by using the photoresist pattern to form a data line; and
   forming a source electrode connected to the data line and a drain electrode spaced apart from the source electrode by dry-etching the channel region of the data metal layer by using the photoresist pattern.

9. The method of claim 8, wherein the first metal layer comprises molybdenum, the second metal layer comprises aluminum, and the third metal layer comprises molybdenum.

10. The method of claim 9, wherein fluorine (F) series gas and chlorine gas (Cl$_2$) are used for simultaneously etching the first metal layer and the active layer by using the photoresist pattern.

11. The method of claim 10, wherein the fluorine (F) series gas comprises sulfur hexafluoride (SF$_6$) gas.

12. The method of claim 11, wherein sulfur hexafluoride (SF$_6$) and chlorine gas (Cl$_2$) are mixed in a ratio from about 1:5 to about 1:7.

13. The method of claim 8, wherein the third metal layer is simultaneously etched in an area corresponding to the channel region in a process of simultaneously dry-etching the first metal layer and the active layer by using the photoresist pattern.

14. The method of claim 8, wherein the active layer comprises a channel layer having amorphous silicon and an ohmic contact layer having amorphous silicon in which ions are doped, and
   the method further comprising forming a thin film transistor by removing the ohmic contact layer within the channel region by using the photoresist pattern after forming the source electrode and the drain electrode.

15. The method of claim 14, further comprising:
   forming a protective film on the substrate having the thin film transistor; and
   forming a pixel electrode on the protective film, the pixel electrode electrically connected to the drain electrode.

16. A method of manufacturing a thin film transistor substrate, the method comprising:
   sequentially forming a gate insulating film and an active layer on a substrate, the substrate having a gate wire including a gate line and a gate electrode connected to the gate line formed thereon;
   forming a data metal layer on the active layer, the data metal layer including a first metal layer, a second metal layer and a third metal layer disposed in sequence;
   forming a photoresist pattern on the data metal layer having a thinner thickness at a channel region than at an adjacent region;
   dry-etching the third metal layer by using the photoresist pattern;
   dry-etching the second metal layer by using the photoresist pattern;

dry-etching the first metal layer by using the photoresist pattern; and, dry-etching the active layer by using the photoresist pattern;

wherein at least two dry-etching processes dry-etching the third metal layer, the second metal layer, the first metal layer, and the active layer by using the photoresist pattern are performed simultaneously.

17. The method of claim 16, wherein the method does not include a wet-etching process.

18. The method of claim 16, wherein the first metal layer includes molybdenum, the second metal layer includes aluminum, and the third metal layer includes molybdenum.

19. The method of claim 16, wherein dry-etching the second metal layer and dry-etching the first metal layer are performed simultaneously.

20. The method of claim 16, wherein dry-etching the first metal layer and dry-etching the active layer are performed simultaneously.

* * * * *